United States Patent [19]

Kopera, Jr.

[11] 4,096,468
[45] Jun. 20, 1978

[54] SOLID STATE SEQUENCE LOGIC CIRCUIT
[75] Inventor: Joseph J. Kopera, Jr., Trenton, Mich.
[73] Assignee: Chrysler Corporation, Highland Park, Mich.
[21] Appl. No.: 276,635
[22] Filed: Jul. 31, 1972
[51] Int. Cl.² .......................................... B60R 21/10
[52] U.S. Cl. ............................. 340/52 E; 340/278; 307/10 SB; 180/82 C
[58] Field of Search .............. 340/52 R, 52 E, 223, 340/278; 307/10 SB, 215, 232, 10 R; 180/82 C, 111; 317/134

[56] References Cited
U.S. PATENT DOCUMENTS

| | | | |
|---|---|---|---|
| 2,985,773 | 5/1961 | Dobbie | 307/215 |
| 3,340,523 | 9/1967 | Whitman | 180/82 C |
| 3,399,351 | 8/1968 | Reszka | 307/232 |
| 3,587,950 | 6/1971 | Haigh et al. | 317/134 |
| 3,742,448 | 6/1973 | Motz | 340/52 E |

Primary Examiner—Alvin H. Waring
Attorney, Agent, or Firm—Baldwin & Newtson

[57] ABSTRACT

A solid state sequence logic circuit comprising a plurality of NOR gates fabricated on a single silicon chip generates an electrical signal whenever a seat belt switch is actuated indicating the utilization of the seat belt before a corresponding seat switch is actuated indicating the presence of an occupant. This logic circuit, while primarily intended for use in any type of vehicle, is applicable to determine whenever a plurality of events takes place in an order other than a predetermined order.

10 Claims, 5 Drawing Figures

SOLID STATE SEQUENCE LOGIC CIRCUIT

CROSS REFERENCE TO RELATED APPLICATIONS

An example of the utilization of this circuit is described in the co-pending application entitled "Sequencing Belt and Seat Warning System With Vehicle Start Inhibit" filed on July 31, 1972 by Poul H. Andersen having Ser. No. 276,634 and assigned to the same assignee as this application. An example of a switch and relay network is defined in the co-pending application entitled "Vehicle Safety Belt Sequence Network" filed on July 31, 1972 by Donald W. Yustick, having Ser. No. 276,475 and assigned to the same assignee as this application.

FIELD OF INVENTION

This invention relates in general to switching networks and in particular to solid state sequence switching networks wherein an indication of events happening out of sequence is desired.

SUMMARY OF INVENTION

It is a principal object of this invention to actuate an alarm whenever the order of events is other than a predetermined order.

It is another object of this invention to fabricate a sequence logic circuit utilizing solid state devices.

It is yet another object of this invention whenever the order of events is other than a predetermined order to maintain an alarm indication until the order of events has been corrected to the predetermined order.

In accordance with these and other objects which will become apparent from the following drawings, detailed description and claims, there is described herein a solid state sequence logic circuit for generating an electrical signal whenever a plurality of events do not occur in a predetermined sequence. Each event is represented by a switch means such as a normally open switch that is actuated or closed upon the happening of the event. Electrically connected to the first event switch is a first two input NOR gate. The output of first NOR gate is electrically connected to one input of a second two input NOR gate. The output thereof is electrically connected in a feedback circuit to the second input of the first NOR gate and also electrically connected to one input of a third two input NOR gate. A fourth two input NOR gate has one input electrically connected to the output of the third NOR gate and the other input is electrically connected to the first event switch. A second event switch is electrically connected to the second input of both the second and third NOR gates. The output of the fourth gate is at an enabling level whenever the second event precedes the first event and remains enabling until the second event is cancelled.

DETAILED DESCRIPTION

Figure 1:
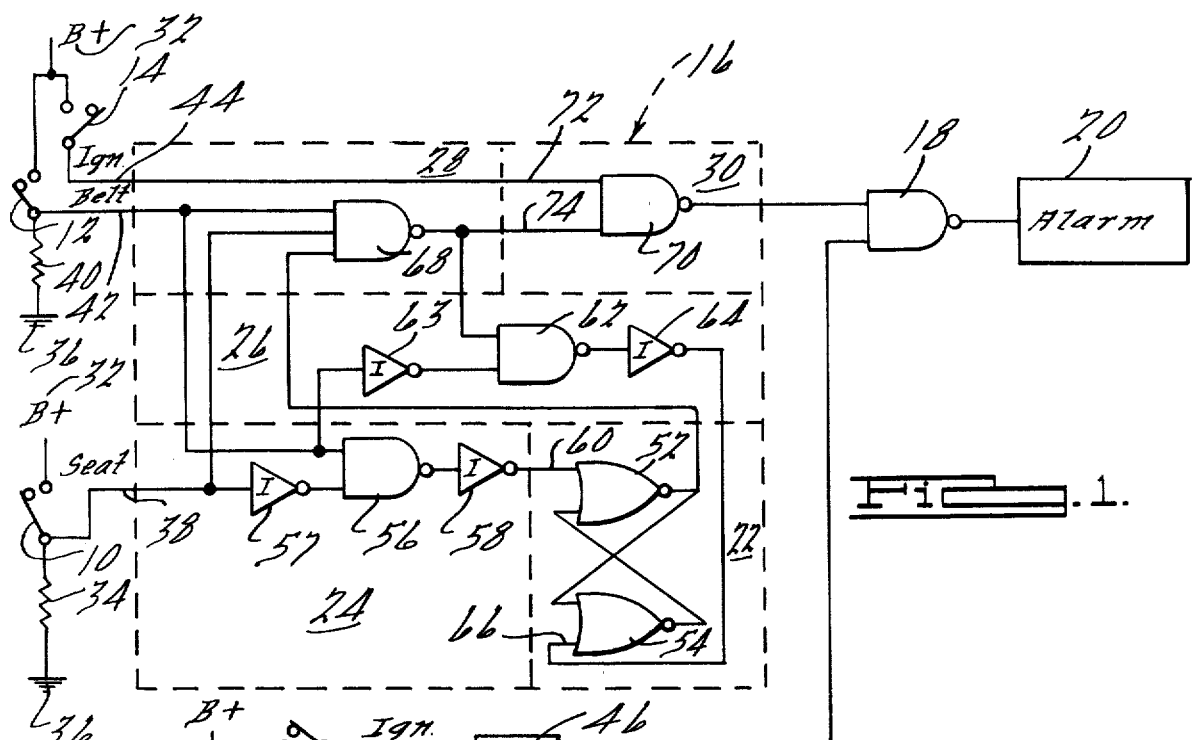
FIG. 1 is a schematic of a sequence logic system as applied to the operation of a safety alarm system in a motor vehicle.

Referring to the figures by their characters of reference, there is illustrated in FIG. 1 a schematic of a seat and seat belt warning alarm system as may be used in a motor vehicle. This system of FIG. 1 comprises a seat switch 10 responsive to the presence of an individual occupying a particular seat position in a vehicle, a belt switch 12 responsive to the utilization of the belt in the corresponding seat position by an individual, and an ignition switch 14 which is responsive to the starting or running position of the vehicle ignition switch. The electrical output signals from each of these switches 10, 12 are applied respectively to a solid state sequence logic network 16. The output of the network 16 is supplied to an alarm control means 18 and from there to the alarm means 20.

The function of the system illustrated in FIG. 1 is to sound the alarm 20 whenever an occupant, in a motor vehicle that is being started or being run, does not have his seat belt fastened. In particular, the sequence logic network of FIG. 1 will sound the alarm if the seat belt is not fastened or if the seat belt is fastened prior to an individual sitting in the vehicle. The enforced sequence of operations is for the individual to become seated in the vehicle and then utilize the seat belt. If such a sequence is followed, the alarm means will not be activated, however, if any other sequence is followed, the alarm means will be activated until such time as the correct sequence is followed.

The sequence logic network 16 comprises a memory section 22, a memory set section 24, a memory erase section 26, a sequence check section 28, and an auxiliary or ignition control section 30. These several sections in the preferred embodiment are all fabricated from solid state devices, and in particular, NAND, NOR and inverter circuits and may be fabricated on a single silicon chip. The logic being used is all positive level logic wherein a high or true signal is typically a voltage level and in the preferred embodiment is a B+ voltage and the low or false signal is a low voltage level and in the preferred embodiment is a ground signal.

The function of the memory section 22 is to generate an electrical signal of one polarity whenever the operation sequence of the seat 10 and belt 12 switches has not been violated and to generate and maintain an electrical signal of the opposite polarity whenever the sequence has been violated and has not been corrected.

The function of the memory set section 24 is to provide an electrical signal to the memory section 22 whenever either one of the two switches 10 or 12 is being operated in the proper sequence. Conversely, the function of the memory erase section 26 is to provide an electrical signal to the memory section 22 whenever the sequence of operation of the switches 10 and 12 is incorrect.

The sequence check section 28 compares the output of the memory section 22 with the condition of the two switches 10 and 12. The sequence check section will generate an output signal of one polarity when both switches are operated and have been operated in the correct sequence and will generate a signal of the opposite polarity whenever the memory section 22 indicates an out-of-sequence operation or that either one of the switches 10 or 12 has not been operated.

The auxiliary or ignition control section 30 functions to control the output from the sequence logic network 16 whenever the ignition switch 14 is in a start or run position and to inhibit an output at all other times.

The four embodiments illustrated in FIGS. 1-4, inclusive, illustrate several modifications of decreasing complexity of the overall system illustrated in FIG. 1. In each of the embodiments, the solid state sequence logic network comprises the above five sections, namely, the memory 22, the memory set 24, the memory erase 26, the sequence check 28 and the auxiliary or ignition control 30.

Referring particularly to the embodiment of FIG. 1, the seat switch 10 is a normally open switch electrically connected between the source of voltage 32 and a resistor 34 to ground 36. When the switch 10 is open the voltage signal on the input line 38 to the sequence logic network 16 is a low level or false signal. When the switch 10 is closed, indicating the presence of an occupant on the seat, the input signal is a high level or true signal. In a similar manner, the seat belt switch 12 in FIG. 1 is a normally open switch and is, likewise, connected between a source of voltage 32 and a resistor 40 to ground 36. Thus, when the belt is not being utilized, the input signal on the input line 42 to the network 16 is at a false level and when the belt is being utilized, the input signal is at a true or high level.

The ignition switch is illustrated as a normally open switch and in the preferred embodiment indicates whenever the vehicle is being started or being run. The IGN signal at this time on the input line 44 to the network 16 from the ignition switch is at a high or true level. Each of the switches may take on many forms, such as the seat belt switch may represent when the seat belt is fastened or when the seat belt itself has ben pulled a predetermined distance from a retractor or placed under a tension in its retractor. The seat switch may be an electronic sensing switch or a mechanical pressure switch.

Figure 2:
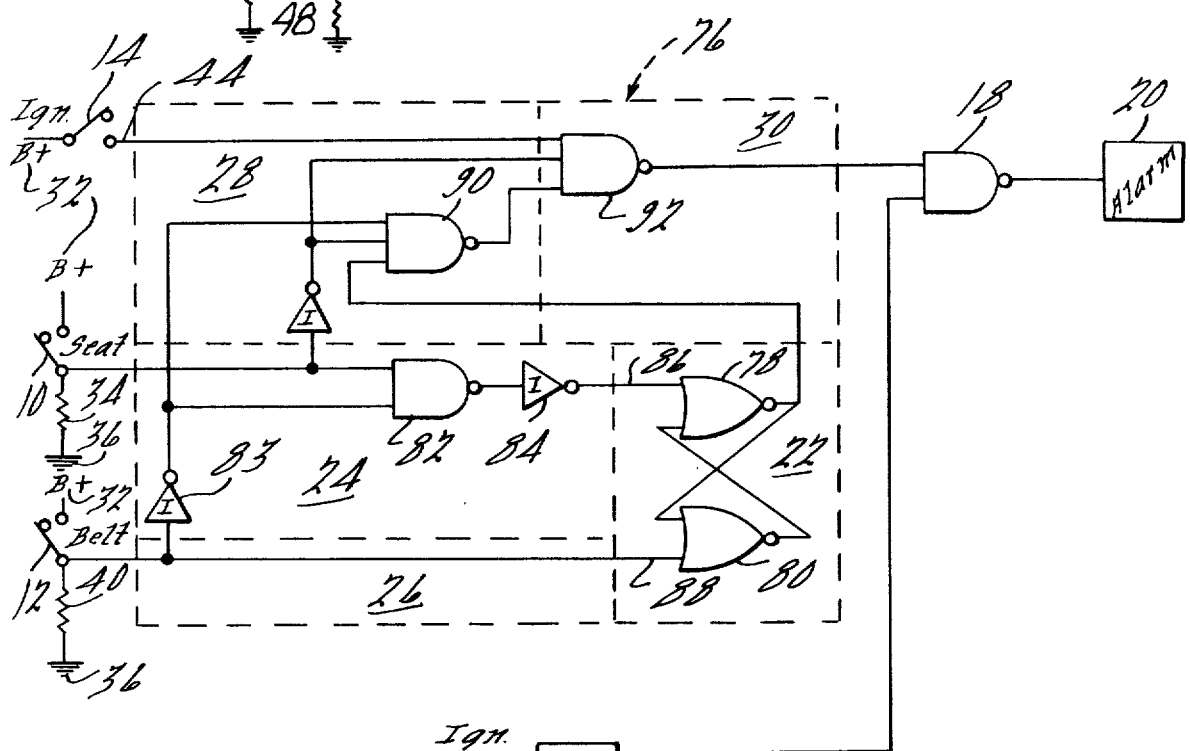
FIG. 2 is an improvement of the logic of FIG. 1 reducing the number of logic elements.
Figure 5:
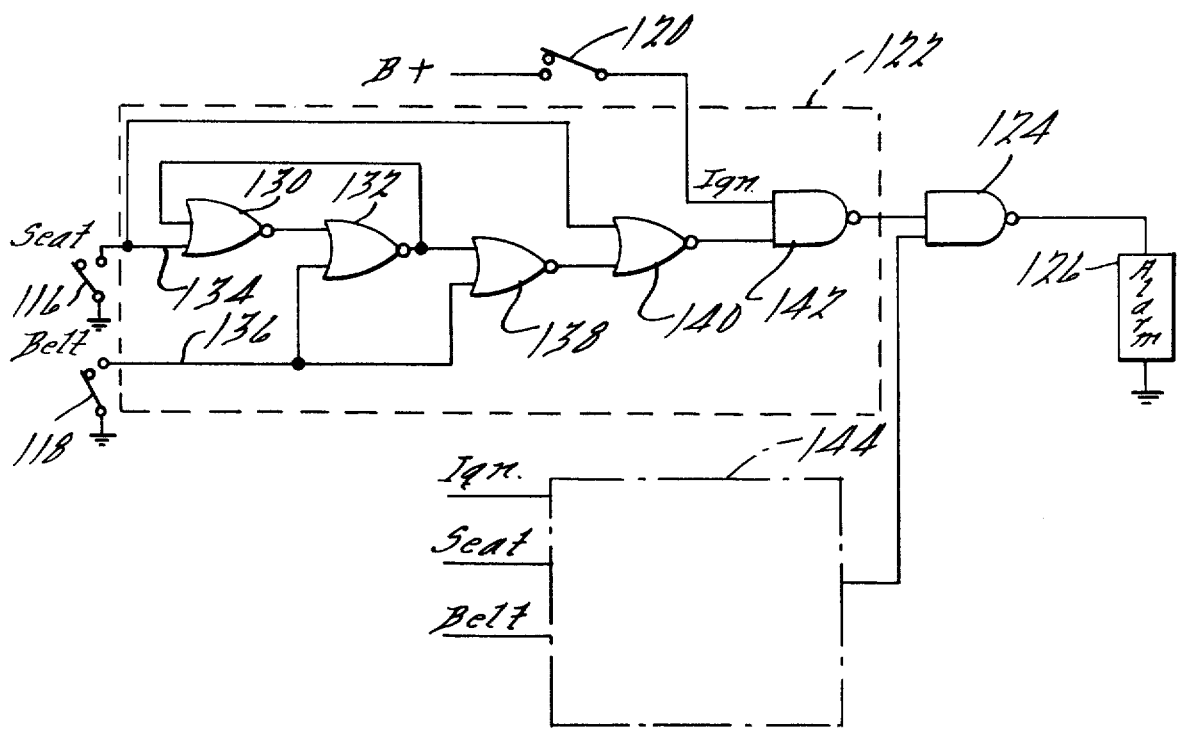
FIG. 5 is a schematic of a safety alarm system for use in a motor vehicle utilizing the logic of FIG. 3 at each occupant position.

The alarm control means 18 in the embodiment illustrated in FIGS. 1, 2 and 5 comprises a NAND gate responsive to the output of the sequence logic networks 16 and 46 for each predetermined occupant position in the vehicle. In each of the FIGS. 1, 2 and 5 there is illustrated a second occupant position and therefore the alarm control means 18 is a two input NAND gate, however, if more positions are to be monitored, the NAND gate will have an additional input for each of the positions. The output of the alarm control means 18 in the preferred embodiment is a high signal whenever all pairs of the switches 10 and 12 or 48 and 50 respectively in any one of the positions are either actuated in the proper sequence or are unactuated. If the actuation of any pair of the switches is other than the predetermined sequence, the output of the alarm control means 18 is a low signal thereby activating the alarm means 20.

Referring particularly to FIG. 1, the memory section 22 is a flip-flop comprising a pair of cross-coupled NOR gates 52 and 54 wherein the output signal from the one gate 52 is high whenever the sequence is proper, and conversely, is low whenever the sequence of operation is other than the predetermined sequence. The memory set section 24 comprises a NAND gate 56 between a pair of inverters 57 and 58 for receiving the input signals from both of the switches 10 and 12 and for supplying an output signal to the set input 60 of the memory 22.

The memory erase section 26, likewise, comprises a NAND gate 62 between a pair of inverters 63 and 64 for supplying its output signal to the reset input 66 of the memory 22. The sequence check section 28 comprises a three input NAND gate 68 receiving signals from the memory section 22 and from each of the switches 10 and 12. The ignition control section 30 is a two input NAND gate 70 receiving a signal from the ignition switch 14 and from the output of the sequence check section 28.

In the normal condition, the output of the memory set section 24 is a low or false signal while the output of all the other sections 22, 26, 28 and 30 are high or true signals. Whenever an individual sits in the car his particular seat switch 10 or 48 closes supplying a high signal to the sequence check NAND gate 68. The memory 22 remains in its normal state inasmuch as the sequence of operation requires that the seat switch 10 be actuated first followed by the belt switch 12. At the present step in the operation, the seat switch 10 is made and the belt 12 has not yet been made, therefore, the memory section 22 indicates that the sequence is still proper.

When the individual buckles or utilizes the seat belt, the seat belt switches 12 or 50 closes causing the output of the sequence check gate 68 to switch from a high to a low level indicating that both switches 10 and 12 or 48 and 50 are made and the sequence of operation is correct. When the ignition switch 14 is actuated this places a high signal at one input 72 of the ignition control gate 70 and since the sequence check section 28 indicates that the sequence is proper, a low signal is at the other input 74 to the ignition control gate 70. This combination of a high and low signal at the two inputs of the ignition control gate 70 generates a high output signal at the alarm control means 18.

If all the inputs to the alarm control means 18 are high, the output is low and the alarm 20 is not activated. However, if any of the inputs to the alarm control gate are low, the output to the alarm 20 is a high signal activating the alarm 20.

As previously indicated, FIG. 1 illustrates a system for use in a motor vehicle for indicating whenever a seat belt is not fastened in a predetermined sequence with the occupying of the seat. In such a sequence the alarm means is sounded or activated.

The logic network 76 of FIG. 2 is a modification of the network 16 of FIG. 1 wherein the memory erase section 26 is much more simplified. Additionally, in the network 76 of FIG. 2, the initial control section 30 has an additional signal from the seat switch 10 controlling the operation of the alarm control means 18. The system illustrated in FIG. 2 is identical to that of FIG. 1 except for the solid state sequence logic network 76. Therefore, all the elements of the system outside of the logic network 76 have the same reference characters as the corresponding element in FIG. 1.

The memory section 22 of the network 76 comprises a flip flop comparing a pair of cross-coupled NOR gates 78 and 80, wherein the output from the one gate 78 is high whenever the sequence of operation is other than the predetermined sequence. The memory set section 24 comprises a NAND gate 82 between the inverters 83 and 84 for receiving the input signals from both of the switches 10 and 12 and for supplying an output signal to the set input 86 of the memory 22. The memory erase section 26 supplies a signal from the belt switch 12 directly to the reset input 88 of the memory section 22. The sequence check circuit 28 comprises a three input NAND gate 90 receiving signals from the memory section 22 and from each of the switches 10 and 12. The ignition control section 30 is a three input NAND gate receiving a signal from the ignition switch 14, a signal from the seat switch 10 and a signal from the output of the sequence check section 28.

In the normal condition, the output of the memory erase section 26 is low or a false signal while the output of all of the other sections 22, 24, 28 and 30 are high or true signals. The memory section 22 receives a set signal on the input 86 whenever the seat switch is actuated first. However, if the belt switch is actuated first, the memory section receives a signal on the reset input 88. The output of the sequence check section 28 is high whenever any of the three input conditions to the NAND gate 90 are not satisfied. These three conditions are: (1) the seat is occupied; (2) the belt is buckled; and (3) the switches were actuated in the proper sequence.

In the ignition control section 30, the NAND gate 92 is a three input NAND gate providing more control over the alarm signal than the corresponding section in FIG. 1. As previously indicated, the ignition control section 30 receives an additional signal other than the output of the sequence check section 28 and the ignition switch 14. This other signal is a signal responsive to the seat switch and will allow an alarm to be outputted from the ignition control section only when the ignition is on, the seat is occupied, and the sequence is improper.

Figure 3:
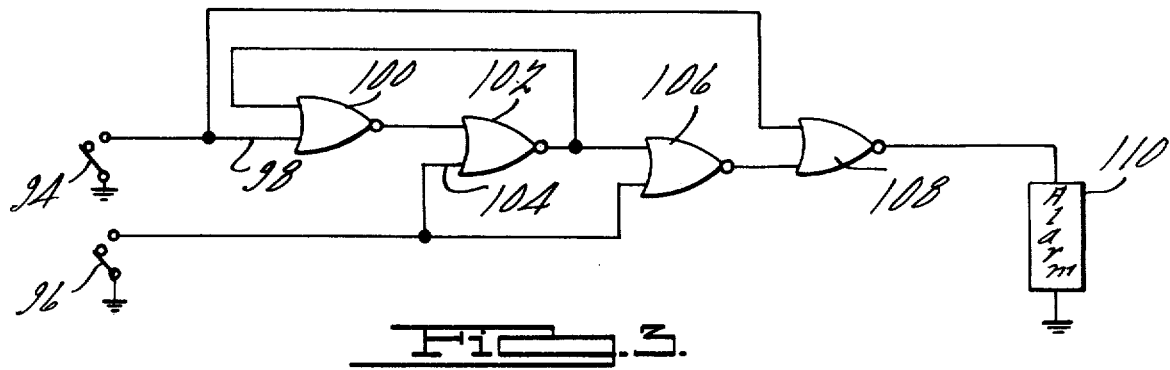
FIG. 3 is the preferred embodiment of the sequence circuit wherein the operation of the seat and belt are represented by normally open switches.
Figure 4:
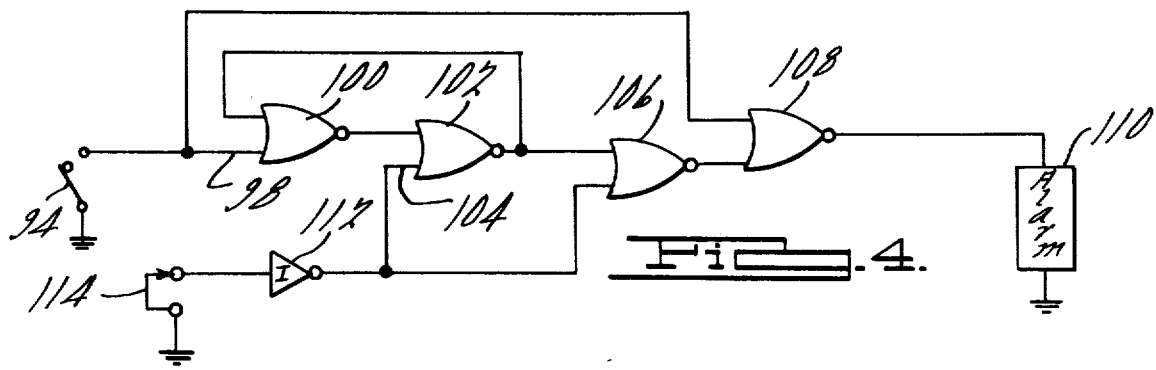
FIG. 4 is a modification of the logic of FIG. 3 wherein one of the switches is a normally closed switch.

Referring to FIGS. 3 and 4, there are illustrated two solid state sequence logic circuits for generating an electrical signal whenever two independent events do not occur in a predetermined sequence. In the preferred embodiment illustrated in FIG. 3 both independent events are illustrated by normally open switches 94 and 96. The first switch 94 is responsive to the happening of the first event which is illustrated by the closing of the switch. The signal from the first switch 94 is electrically connected to one input 98, the set input, of a flip flop comprising first and second cross-coupled NOR gates 100 and 102. A signal from the second switch means 96 representing the second event is electrically connected to the reset input 104 of the second NOR gate 102 and to a third NOR gate 106. The output of the third NOR gate 106 is electrically connected to the fourth NOR gate 108 at one input thereof and the other input of the fourth NOR gate 108 is electrically connected to the first switch means 94. The output of the fourth NOR gate 108 is electrically connected to the alarm means 110 which will be energized whenever the two events have not occurred in a predetermined sequence. The output from the fourth NOR gate 108 will be high under the following conditions: (1) whenever the first switch 94 is actuated indicating the first event and the second switch has not been actuated; (2) whenever the second switch has been actuated indicating the second event has happened and when the first switch is actuated indicating that the first event has happened following the second event.

Referring to FIG. 4 there is illustrated a modification of the circuit of FIG. 3 wherein one of the switches, in this example the second switch, is a normally closed switch. In order to maintain the logic the same as that of FIG. 3, an inverter 112 is inserted in the output of the second switch means 96. In this particular embodiment, the first switch means 94 is responsive to the happening of the first event and is represented by the normally open switch. The second switch means 96 is responsive to the happening of the second event and is represented by a normally closed switch 114. Thus when the second switch 114 opens, the inverter 112 inverts that actuation signal into the proper signal levels for the second and third NOR gates 102 and 106.

Referring to FIG. 5, there is illustrated a schematic of a seat belt warning alarm system incorporating the logic of FIG. 3. This system comprises a normally open seat switch 116, a normally open seat belt switch 118 and an ignition switch 120, having their electrical outputs applied respectively to a solid state sequence logic network 122. The output of the network 122 is supplied to an alarm control means 124 and from there to an alarm means 126.

The sequence logic network 122 comprises a memory section having first and second cross-coupled NOR gates 130 and 132, a memory set section comprising the input line 134 from the normally open seat switch 116 to the first NOR gate 130, a memory erase section comprising the electrical connection 136 between the normally open seat belt switch and the second NOR gate 132, a sequence check section comprising a third NOR gate 138 and a seat and ignition control section comprising a fourth NOR gate 140 and a NAND gate 142. As in the previous embodiments of FIGS. 1 and 2, the alarm means 126 is responsive to any violation of the predetermined sequence of operations of the normally open seat switch 116, seat belt switch 118 and an ignition switch 120. Thus the output of the NAND gate 142 is low whenever there is an error in the sequence of operation of the seat and seat belt switches and the ignition switch is actuated. A low signal supplied to the alarm control means 124 will activate the alarm means 126.

In order to check another seat section of the vehicle, there is an additional solid state logic network 144 which is identical to that of 122 which is electrically connected to the alarm control means 124. If there is not an occupant in this second position, the output of the solid state logic network 144 will be a high signal and will not activate the alarm 126.

There has thus been shown and described a solid state sequence logic circuit for generating an electrical signal whenever a plurality of independent events do not occur in a predetermined sequence. The network comprises a memory section, a memory set section, a memory erase section, a sequence check section and an auxiliary or ignition control section. When such a sequence network is applied or utilized in a motor vehicle for checking the sequence of operations of using a seat belt, the auxiliary control section is responsive to the ignition switch of the vehicle.

What is claimed is:

1. A solid state sequence logic circuit for generating an electrical signal whenever a plurality of independent events do not occur in a predetermined sequence, said circuit comprising:

a first means for receiving an electrical signal responsive to a first event;

a first NOR gate having first and second input terminals and an output terminal, wherein its said first input terminal is electrically connected to said first means;

a second NOR gate having first and second input terminals and an output terminals, wherein its said first input terminal is electrically connected to the output terminal of said first NOR gate and its said output terminal is electrically connected to the second input terminal of said first NOR gate;

a third NOR gate having first and second input terminals and an output terminal, wherein its said first input terminal is electrically connected to the output terminal of said second NOR gate;

a fourth NOR gate having first and second input terminals and an output terminal, wherein its said first input terminal is electrically connected to said first means and its said second input terminal is electrically connected to the output terminal of said third NOR gate; and a second means for receiving another electrical signal responsive to a second event electrically connected to said second input terminal of each of said second and third NOR gates where in the normal state all the electrical signals on said output terminals are electrically disabling and the output signal from said fourth NOR gate is electrically enabling whenever said first event is not succeeded by said second event.

2. The solid state sequence logic circuit according to claim 1 wherein said electrical signals received by first and second means are normally electrically enabling and are electrically disabling when said events occur.

3. The solid state logic circuit according to claim 1 further including first and second normally open switches electrically connected respectively to said first and second means.

4. The solid state logic circuit according to claim 1 additionally including:
  a third means for receiving a third electrical signal responsive to a third event, and
  a comparator having a first input terminal electrically connected to the output terminal of said fourth NOR gate, a second input terminal electrically connected to said third means and an output terminal, said comparator comparing said third electrical signal with the output signal from said fourth NOR gate and generating a disabling signal when said output signal from said fourth NOR gate is electrically enabling and said third event occurs.

5. The solid state logic circuit according to claim 1 further including a normally open switch electrically connected to said first means, a normally closed switch, and an inverter electrically connected in series between said normally closed switch and said second means.

6. The solid state logic circuit according to claim 4 wherein said third electrical signal is normally electrically disabling and is electrically enabling when said third event occurs.

7. The solid state logic circuit according to claim 4 further including a third normally open switch electrically connected to said third means.

8. The solid state logic circuit according to claim 4 wherein said comparator is a NAND gate having at least two input terminals and an output terminal.

9. In a motor vehicle, a seat and safety belt sequence warning system for indicating whenever a safety belt is not fastened by an occupant in a predetermined order relative to seat occupancy, said system comprising:
  at least one occupant position having,
    a seat switch to be actuated in response to the presence of at least a predetermined weight resting thereon; and
    a safety belt switch to be actuated in response to the utilization of an associated safety belt;
  an ignition switch connected in electrical circuit with the starting and ignition circuit of the vehicle, for controlling the starting and running of the vehicle, said ignition switch generating an electrical signal when actuated;
  a solid state sequence logic circuit electrically connected in circuit with said seat switch and said safety belt switch and responsive to a predetermined order of actuation of said seat switch and said safety belt switch for the generation of an electrical signal whenever the actuation of said safety belt switch does not follow the actuation of said seat switch; and
  an alarm responsive to said electrical signal from said solid state sequence logic circuit and said electrical signal from said ignition switch for indicating the violation of said predetermined order of seat and safety belt switch actuation wherein said solid state sequence logic circuit comprises:
  a first NOR gate having first and second input terminals and an output terminal wherein its said first input terminal is electrically connected to said seat switch;
  a second NOR gate having first and second input terminals and an output terminal wherein its said first input terminal is electrically connected to said output terminal of said first NOR gate, its said second input terminal is electrically connected to said safety belt, and its said output terminal is electrically connected to said second input terminal of said first NOR gate;
  a third NOR gate having first and second input terminals and an output terminal wherein its said first input terminal is electrically connected to said output terminal of said second NOR gate, its said second input terminal is electrically connected to said safety belt switch; and
  a fourth NOR gate having first and second input terminals and an output terminal wherein its said first input terminal is electrically connected to the output terminal of said third NOR gate, its said second input terminal is electrically connected to said seat switch whereby the signal on the output terminal of said fourth NOR gate is enabling whenever said safety belt switch is actuated prior to said seat switch so that said alarm is enabled to indicate the violation.

10. In a motor vehicle, a seat and safety belt sequence warning system for indicating whenever a safety belt is not fastened by an occupant in a predetermined order relative to seat occupancy, said system comprising:
  at least one occupant position having,
    a seat switch to be actuated in response to the presence of at least a predetermined weight resting thereon, and
    a safety belt switch to be actuated in response to the utilization of an associated safety belt;
  an ignition switch connected in electrical circuit with the starting and ignition circuit of the vehicle, for controlling the starting and running of the vehicle, said ignition switch generating an electrical signal when actuated;
  a solid state sequence logic circuit electrically connected in circuit with said seat switch and said safety belt switch and responsive to a predetermined order of actuation of said seat switch and said safety belt switch for the generation of an electrical signal whenever the actuation of said safety belt switch does not follow the actuation of said seat switch; and an alarm responsive to said electrical signal from said solid state sequence logic circuit and said electrical signal from said ingition switch for indicating the violation of said predetermined order of seat and safety belt switch actuation wherein said safety belt switch comprises a switch whose contacts are actuated independently of seat occupancy condition by predetermined positioning of said safety belt such that the switch contacts are open when the safety belt is not in use and are closed when the safety belt is in use.

* * * * *